(12) United States Patent
Nygren

(10) Patent No.: US 6,781,438 B2
(45) Date of Patent: Aug. 24, 2004

(54) METHOD AND DEVICE FOR GENERATING A REFERENCE VOLTAGE

(75) Inventor: Aaron Nygren, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/413,814

(22) Filed: Apr. 15, 2003

(65) Prior Publication Data

US 2003/0193358 A1 Oct. 16, 2003

(30) Foreign Application Priority Data

Apr. 15, 2002  (DE) .......................................... 102 16 615

(51) Int. Cl.[7] .................................................. H03K 3/01
(52) U.S. Cl. ...................................... 327/530; 327/336
(58) Field of Search .............................. 327/63, 64, 65, 327/68, 69, 70, 77, 80, 82, 88, 89, 336, 530, 534

(56) References Cited

U.S. PATENT DOCUMENTS 5,598,438 A    1/1997  Lepping 6,201,822 B1    3/2001  Okayasu
6,407,591 B1 *  6/2002  Wong et al. .................. 327/63

FOREIGN PATENT DOCUMENTS

DE    42 36 774 A1    5/1994
DE    198 37 859 A1   3/1999

* cited by examiner

*Primary Examiner*—Jeffrey Zweizig
(74) *Attorney, Agent, or Firm*—Laurence A. Greenberg; Werner H. Stemer; Ralph E. Locher

(57) ABSTRACT

A method and a device generate a reference voltage for discriminating between the logic states of a data signal received at a receiving end. A transmitting device transmits a continuous clock signal with a constant pulse period duration and a symmetrical sequence of low and high clock signal states in such a way that, at the receiver end, the clock signal has the same low and high voltage levels as the received data signal and it is subject to the same system-governed variations as the received data signal. An integrator at the receiver end receives and integrates the clock signal, and the integrated value becomes the reference voltage for the receiver unit.

9 Claims, 2 Drawing Sheets

METHOD AND DEVICE FOR GENERATING A REFERENCE VOLTAGE

BACKGROUND OF THE INVENTION

Field of the Invention

The invention relates to a method and a device for generating a reference voltage for discriminating the logic states of a data signal received in at least one receiver unit.

In every signal-transmitting system, be it a bidirectional or unidirectional system, a driver transmits a signal from a first point via a line or transmission link to a second point, where the signal is received. Equally, in a bidirectional system, a signal can be sent from the second point to the first point of the transmission link or of the transmission line, where it is likewise received and subsequently decoded. In the simplest case, a receiver unit forms the decoding of the signal in the form of a conversion depending on the logic state thereof into a level that is known in each case. To that end, the output of the receiver unit is switched back and forth between the two known signal levels, depending on whether or not the received signal level exceeds a specific threshold value (for example in the form of a reference voltage).

In prior art systems, the reference voltage $V_{ref}$ is typically generated outside a module and fed to the module and applied to the receiver units in the form of a predetermined voltage value. The value of the reference voltage is usually placed in the middle between the ideal highest value and lowest value of the received data signal, independently of the leading and trailing edges of the signal. However, there are a series of influencing variables which cause the reference voltage $V_{ref}$ to deviate from this mean value. Such deviations may be brought about by changes in the generated and received reference voltage itself and by the oscillation shape of the received data signals. By far the most frequent form of influence originates from deviations in the drivers which drive the data signals. In some systems, deviations are also brought about by the way in which the data signals are terminated. If the drivers of the data signals have an asymmetrical driver resistance for high and low levels and/or if the terminating resistance leads to an asymmetrical termination for high and low levels, the received data signal is not centered about its mean value, that is to say about the value of the generated reference voltage $V_{ref}$. This leads to non-optimal temporal tolerances particularly in DDR memory systems, in which the data signals are expected to be completely symmetrical with regard to their leading and trailing edges.

SUMMARY OF THE INVENTION

It is accordingly an object of the invention to provide a method and a device for generating a reference voltage and for discriminating between logic states of a received data signal which overcomes the above-mentioned disadvantages of the heretofore-known devices and methods of this general type and wherein the generated reference voltage leads to optimal signal time tolerances.

With the foregoing and other objects in view there is provided, in accordance with the invention, a method of generating a reference voltage, which comprises:

electrically transmitting a data signal and a continuous clock signal from a transmitting part to a receiving part;

the clock signal received at the receiving part being a continuous sequence of low and high clock signal states with a constant period duration, the clock signal received at the receiving part having low and high voltage levels corresponding to low and high levels of the data signal received at the receiving part, and the clock signal and the received data signal being subject to common system-governed electrical variations; and integrating the clock signal at the receiver part during a specific time duration prior to receiving the data signal and generating the reference voltage from the clock signal at the receiving part.

In accordance with a primarily important aspect, therefore, the invention provides for a method for generating a reference voltage for discriminating the logic states of a received data signal. In addition to the data signal, a continuous clock signal is transmitted to the receiver end, which, at the receiver end, is a continuous sequence of low and high clock signal states with a constant period duration, and the reference voltage is generated from a time average of the low and high signal states of the clock at the receiver end. Specifically according to the invention:

the data signal and the clock signal are transmitted and received electrically;

the received clock signal has the same low and high voltage level as a received data signal and, in a manner governed by the system, is subjected to the same electrical variations as the received data signal; and at the receiver end, an integration of the received clock signal is carried out during a specific time duration before the reception of the data signal.

The continuous clock signal which serves for generating the reference voltage has a constant pulse period duration and has a symmetrical sequence of low and high clock signal states, for example a clock signal pattern such as "101010101010" or "1100110011001100" etc. Situated on the module or chip which generates the reference voltage $V_{ref}$ from the clock signal is an integrator which integrates the received clock signal over a certain time duration before the reception of the data signal and, from this, generates the reference voltage adaptively to the changes in the data signal which are caused by the driver variations and terminating resistance variations.

With the above and other objects in view there is also provided, in accordance with the invention, a device for generating a reference voltage for discriminating between logic states of a data signal. The device comprises:

at least one receiver unit having an input for receiving the data signal and an input for receiving a continuous electrical clock signal formed of a sequence of low and high clock signal states;

the electrical clock signal and the electrical data signal received by said receiver unit having mutually corresponding low and high voltage levels and being subject to mutually corresponding system-governed electrical variations as the received data signal; and an integrator for integrating the clock signal received at said receiver unit during a specific time duration prior to receiving the data signal and for generating the reference voltage from an integrated value of the clock signal.

In other words, in accordance with this second aspect of the invention, a device for generating a reference voltage for discriminating the logic states of a data signal received in at least one receiver unit, the receiver unit additionally being set up to receive a continuous clock signal as a sequence of low and high clock signal states and to form a reference voltage from a time average of the low and high signal states of the clock signal, is characterized by the following:

the received electrical clock signal has the same low and high voltage levels as the received electrical data signal and is subjected to the same system-governed electrical variations as the received data signal; and the receiver unit has an integrator, which integrates the received clock signal during a specific time duration before the reception of the data signal and generates the reference voltage from an integrated value of said signal.

In a DDR-DRAM system—serving as a system example—which contains data signals DQ and data strobe signals DQS, the data strobe signal DQS is used as the additional clock signal for generating the reference voltage $V_{ref}$ since it is a clock signal which is subjected to the same system-governed variations as the received data signal DQ. If, as required, the integrator integrates the data strobe signal DQS for long enough before the data signal DQ is received, the reference voltage can be generated as a continuous value by the integrator. The reference voltage generated by the integrator ensures that the time duration during which the incoming data signal DQ lies above the reference voltage is just as long as the time duration during which the incoming data signal DQ lies below the reference voltage. This corresponds to a duty ratio of 50%.

It goes without saying that, in addition to the abovementioned DQS signal for the clock signal from which, according to the invention, the reference voltage is derived by integration, it is possible to use any other clock signal which meets the above conditions and can be integrated or averaged over a specific time duration.

In accordance with a concomitant feature of the invention, the clock signal and the data signal are driven with a common type, i.e., the same type of driver amplifier.

Other features which are considered as characteristic for the invention are set forth in the appended claims.

Although the invention is illustrated and described herein as embodied in a method and device for generating a reference voltage, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
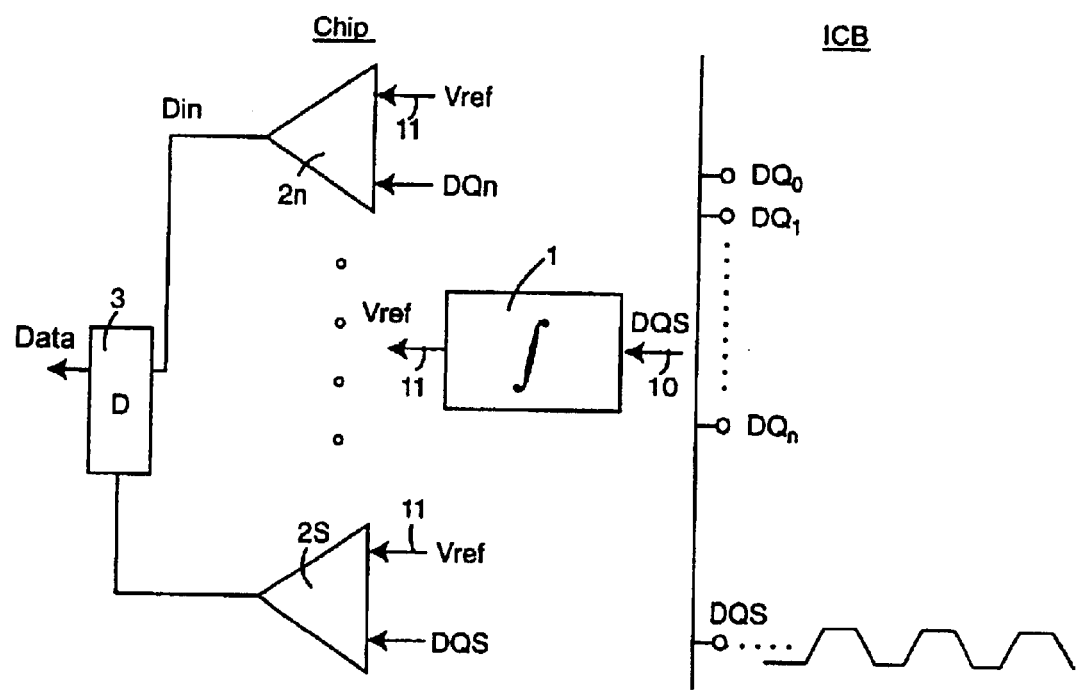
FIG. 1 is a schematic diagram showing an exemplary embodiment of the device according to the invention with relevant signals of a DDR-DRAM system.

Referring now to the figures of the drawing in detail and first, particularly, to FIG. 1 thereof, there is shown an exemplary embodiment of the device according to the invention with reference to an example with the generation of the reference voltage $V_{ref}$ for the data reception of data DQ transmitted between DDR-DRAM modules. The right-hand portion of FIG. 1 represents an interface between an integrated circuit board ICB and the signals which play a part in the invention, generally referred to as a transmitting part. Data signals DQ0, DQ1, . . . , DQn and a data strobe signal DQS are received. The data signals DQ0, DQ1, . . . , DQn are fed to receiver units $2n$ on the DDR-DRAM chip illustrated diagrammatically on the left. The left-hand side is referred to as a receiving part. The clock or data strobe signal DQS is fed to a receiver unit $2s$ and an input line 10 of an integrator 1. According to the invention, the integrator 1 generates the reference voltage $V_{ref}$ on a line 11 by integration of the data strobe signal DQS fed via the input line 10. As already mentioned, the data strobe signal DQS is a continuous signal with a constant pulse period duration and a symmetrical sequence of low and high signal states, has the same low and high voltage levels as a received data signal and is subjected to many of the system-governed variations to which the received data signal DQ is also subjected. By way of the integration of this data strobe signal DQS in the integrator 1, the reference voltage $V_{ref}$ is generated adaptively to the data signals DQn and accordingly adapts to the system variations for example in the driver modules and/or the terminations of the signals. A precondition is that the data strobe signal DQS can be integrated for long enough before the data signals DQ0, DQ1, . . . , DQn arrive. The reference voltage $V_{ref}$ generated by the integrator 1 is fed to the receiver units $2n$ and $2s$ via the line 11. The output signal of the receiver unit $2s$, which receives the data strobe signal DQS, serves as an activation signal for data buffers (latches) 3 in which the input data DIN output by the receiver units $2n$ are buffer-stored.

According to the invention, the integrator 1 generates the reference voltages $V_{ref}$ on the basis of the voltage levels and the duty ratio of the data strobe signal DQS fed to it.

It should be mentioned that, in the prior art, instead of the reference voltage $V_{ref}$ generated adaptively according to the invention, a fixed reference voltage which is generated on the integrated circuit board ICB and is equal to Vcc/2 is usually fed to the receiver units $2n$ and $2s$ externally.

According to the invention, the integrator 1 can also be fed, in addition to the data strobe signal DQS for generating the reference voltage $V_{ref}$, any other clock signal which is present in the system and is subjected to the same system-governed variations as the received data signal DQ and can be integrated over a specific time duration before the reception of the data signal DQ.

In DDR-DRAM memory systems, the integrator 1 provided according to the invention can be provided on each memory chip and also on a memory controller chip.

Figure 2A:
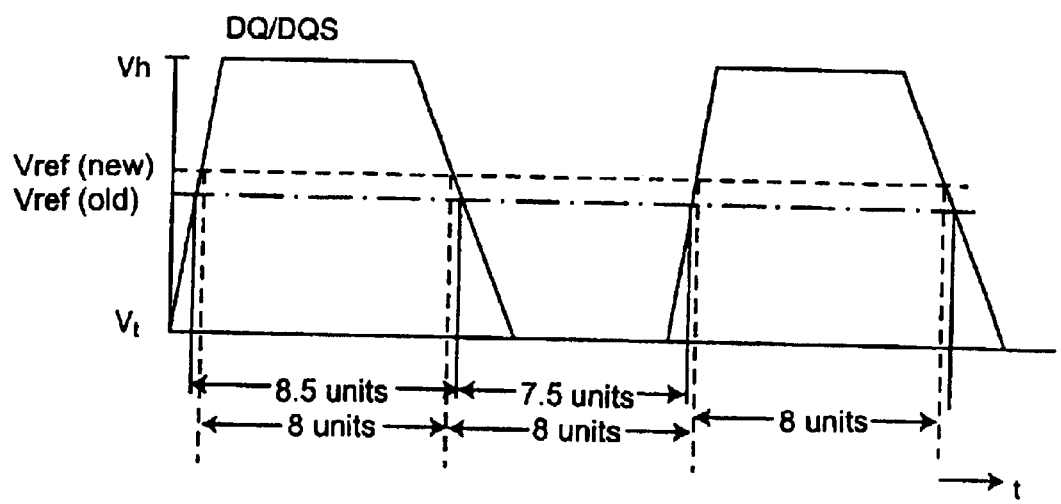
FIG. 2A is a signal graph with a first pulse/time diagram for illustrating a first functional mode of the device according to the invention shown in FIG. 1.

The pulse-time diagram illustrated in FIG. 2A shows a first mode of functioning of the above-described device according to the invention which is illustrated diagrammatically in FIG. 1. The pulses illustrate a nonterminated data signal or data strobe signal DQ/DQS with a strong pull-up driver and a weak pull-down. As a result, a significantly different steepness of the leading and trailing edges of the signal pulses is established in each case. If, as in the prior art, the reference voltage $V_{ref}$ were generated and fed in externally to the chip as a fixed voltage equal to Vcc/2, as is indicated by the dash-dotted line designated by $V_{ref}$(old) in FIG. 2A, this would lead to an asymmetrical duty ratio at the output of the receiver units $2n$ and $2s$. The pulse width would then be 8.5 time units, for example, and the spacing width would be 7.5 time units. The generation—proposed according to the invention—of the reference voltage which is represented by a dashed horizontal line and designated by $V_{ref}$ (new) shifts the threshold upward, as a result of which the duty ratio once more becomes symmetrical. In the illustrated example, the pulse width is then eight time units and the spacing width is likewise eight time units. The integration of the supplied clock signal DQS ensures that the area under the curve above and below the reference voltage generated by integration is identical in each case. The foregoing text therefore shows that the invention can likewise be used for a duty ratio correction device.

Figure 2B:
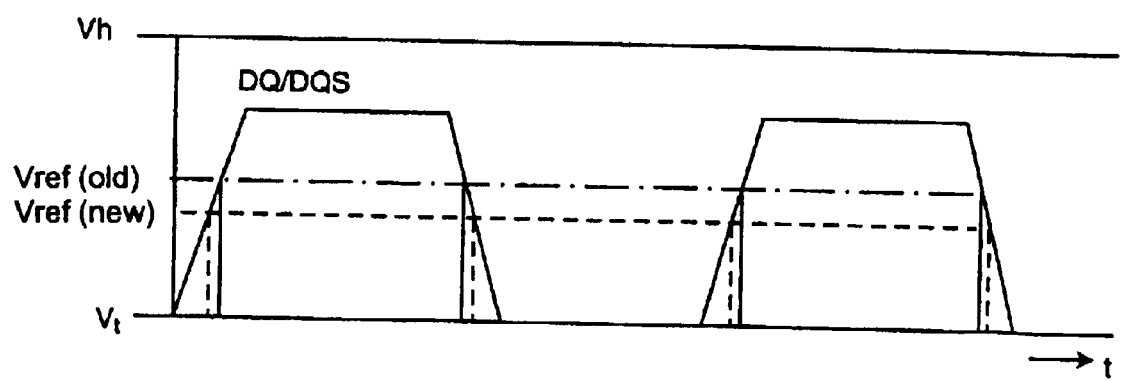
FIG. 2B is a signal graph with a timing diagram for illustrating a second functional mode of the device according to the invention shown in FIG. 1.

The pulse timing diagram illustrated in FIG. 2B illustrates a second mode of functioning of the invention, in which a terminated signal does not reach its high desired level $V_h$ because either the pull-up resistance is too high and/or the termination with respect to $V_h$ is too high. Whereas an asymmetrical duty ratio of the received data signal would be produced by way of a fixed reference voltage in accordance with the prior art (cf. the dash-dotted line designated $V_{ref}$ (old) in FIG. 2B), the reference voltage $V_{ref}$ (new) which is obtained by integration of the clock signal DQS and is represented by a dashed line provides for a symmetry of the duty ratio of the received data signal.

The above-described use of the method according to the invention for data transmission between DDR-DRAM modules is only by way of example.

The method according to the invention for generating a reference voltage for discriminating the logic states of a received data signal is wherein, in addition to the data signal, a clock signal is generated and transmitted to the receiver end, which is subjected at least to a portion of the system-governed variations as experienced by the received data signal, in that an integration of the clock signal takes place at the receiver end, and in that the reference voltage is generated from the integrated value of the clock signal at the receiver end. As a result, the method according to the invention can be employed in any data transmission or signal transmission system in which a unidirectional or bidirectional data or signal transmission takes place and in which the logic states of the received signal are decoded by the discrimination by way of a reference voltage which has a level between the highest and the lowest level of the received signal.

I claim:

1. A method of generating a reference voltage, which comprises:
    electrically transmitting a data signal and a continuous clock signal from a transmitting part to a receiving part;
    the clock signal received at the receiving part being a continuous sequence of low and high clock signal states with a constant period duration, the clock signal received at the receiving part having low and high voltage levels corresponding to low and high levels of the data signal received at the receiving part, and the clock signal and the received data signal being subject to common system-governed electrical variations; and
    integrating the clock signal at the receiver part during a specific time duration prior to receiving the data signal and generating the reference voltage from the clock signal at the receiving part.

2. The method according to claim 1, which further comprises discriminating between defined logic states of the received data signal on the basis of the reference voltage generated by integrating the clock signal.

3. The method according to claim 1, which comprises driving the clock signal and the data signal with a common type of driver amplifier.

4. The method according to claim 1, which comprises transmitting data to and from DDR-DRAM modules, and using a data strobe signal as the clock signal.

5. The method according to claim 4, which comprises integrating the received data strobe signal at least on each DDR-DRAM chip.

6. The method according to claim 5, which comprises additionally integrating the data strobe signal in a memory controller module receiving the data.

7. A device for generating a reference voltage for discriminating between logic states of a data signal, comprising:
    at least one receiver unit having an input for receiving the data signal and an input for receiving a continuous electrical clock signal formed of a sequence of low and high clock signal states;
    the electrical clock signal and the electrical data signal received by said receiver unit having mutually corresponding low and high voltage levels and being subject to mutually corresponding system-governed electrical variations as the received data signal; and
    an integrator for integrating the clock signal received at said receiver unit during a specific time duration prior to receiving the data signal and for generating the reference voltage from an integrated value of the clock signal.

8. The device according to claim 7, wherein said integrator forms a part of said receiver unit.

9. The device according to claim 7, wherein the data are data transmitted between DDR-DRAM modules, and the clock signal is a data strobe signal.

* * * * *